(12) United States Patent
Deng

(10) Patent No.: US 10,834,826 B2
(45) Date of Patent: Nov. 10, 2020

(54) GLUE DISPENSING METHOD AND CIRCUIT BOARD

(71) Applicant: Huawei Technologies Co., Ltd., Shenzhen (CN)

(72) Inventor: Lingchao Deng, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/079,958

(22) PCT Filed: Feb. 25, 2016

(86) PCT No.: PCT/CN2016/074537
§ 371 (c)(1),
(2) Date: Aug. 24, 2018

(87) PCT Pub. No.: WO2017/143556
PCT Pub. Date: Aug. 31, 2017

(65) Prior Publication Data
US 2019/0059159 A1    Feb. 21, 2019

(51) Int. Cl.
*H05K 3/28* (2006.01)
*H05K 3/34* (2006.01)
(Continued)

(52) U.S. Cl.
CPC ............ *H05K 3/28* (2013.01); *H05K 1/181* (2013.01); *H05K 3/328* (2013.01); *H05K 3/3436* (2013.01);
(Continued)

(58) Field of Classification Search
CPC ............ H05K 3/28; H05K 1/18; H05K 3/328; H05K 3/3436; H05K 23/488;
(Continued)

(56) References Cited

U.S. PATENT DOCUMENTS 5,697,148 A * 12/1997 Lance, Jr. ............. H01L 21/563
174/260
5,864,178 A *  1/1999 Yamada ................ H01L 21/563
257/737

(Continued)

FOREIGN PATENT DOCUMENTS

CN        1592546 A     3/2005
CN     201112376 Y     9/2008
(Continued)

OTHER PUBLICATIONS

Fujihira, Masaki, "Multilayer Printed Circuit Board Keywords 100," Kogyo Chosakai Publishing Co. Ltd., Oct. 20, 1987, 5th edition, pp. 240-241 with 1 page English translation, Japan.

*Primary Examiner* — Pete T Lee
(74) *Attorney, Agent, or Firm* — Slater Matsil, LLP

(57) ABSTRACT

A glue dispensing method includes making a glue dispensing hole in a processing region. The processing region is a region that is in a surface mount region corresponding to the surface mount component and in which no electronic circuit and pad exist. The method also includes welding the surface mount component onto the circuit board. The method further includes injecting glue into the glue dispensing hole, to fill a gap between the surface mount component and the circuit board, and placing the circuit board still, to wait for curing of the glue.

15 Claims, 4 Drawing Sheets

---

Make a glue dispensing hole in a processing region, where the processing region is a region that is in a surface mount region corresponding to a surface mount component and in which no electronic circuit and pad exist — S101

Weld the surface mount component onto a circuit board — S102

Inject glue into the glue dispensing hole, to fill a gap between the surface mount component and the circuit board, and place the circuit board still, to wait for curing of the glue — S103

(51) Int. Cl.
*H05K 1/18* (2006.01)
*H05K 3/32* (2006.01)
*H01L 23/488* (2006.01)

(52) U.S. Cl.
CPC .. *H01L 23/488* (2013.01); *H05K 2201/09072* (2013.01); *H05K 2201/10325* (2013.01); *H05K 2201/10734* (2013.01); *H05K 2201/10977* (2013.01)

(58) Field of Classification Search
CPC .......... H05K 2201/09072; H05K 2201/10325; H05K 2201/10734; H05K 2201/10977
See application file for complete search history.

(56) References Cited

U.S. PATENT DOCUMENTS

| | | | | |
|---|---|---|---|---|
| 6,057,178 A | * | 5/2000 | Galuschki | H01L 21/563 257/E21.503 |
| 6,066,509 A | | 5/2000 | Akram et al. | |
| 6,157,080 A | * | 12/2000 | Tamaki | H01L 23/3121 257/738 |
| 7,485,502 B2 | * | 2/2009 | Jeon | H01L 21/563 257/787 |
| 9,418,965 B1 | * | 8/2016 | Li | H01L 25/0655 |
| 2002/0111016 A1 | | 8/2002 | Farquhar et al. | |
| 2005/0218528 A1 | * | 10/2005 | Beatty | H05K 3/305 257/778 |
| 2014/0175674 A1 | | 6/2014 | Chen | |
| 2015/0351245 A1 | * | 12/2015 | Chen | H05K 1/181 361/717 |
| 2016/0268710 A1 | * | 9/2016 | Zhang | H05K 7/1038 |

FOREIGN PATENT DOCUMENTS

| | | |
|---|---|---|
| CN | 201233912 Y | 5/2009 |
| CN | 203026500 U | 6/2013 |
| CN | 103345886 A | 10/2013 |
| CN | 203300159 U | 11/2013 |
| CN | 204131474 U | 1/2015 |
| JP | H03222338 A | 10/1991 |
| JP | H1126484 A | 1/1999 |
| JP | H11340375 A | 12/1999 |

* cited by examiner

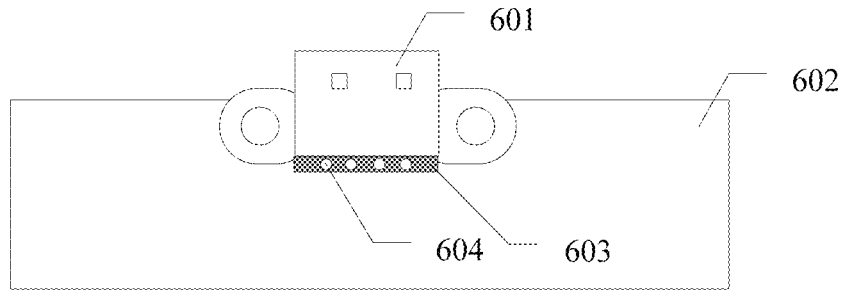

FIG. 6

| |
|---|
| Make a glue dispensing hole in a processing region, where the processing region is a region that is in a mount region corresponding to a connector socket and in which no electronic circuit and pad exist — S701 |
| Weld the connector socket onto a circuit board — S702 |
| Inject glue into the glue dispensing hole, to fill a gap between the connector socket and the circuit board, and place the circuit board still, to wait for curing of the glue — S703 |

FIG. 7

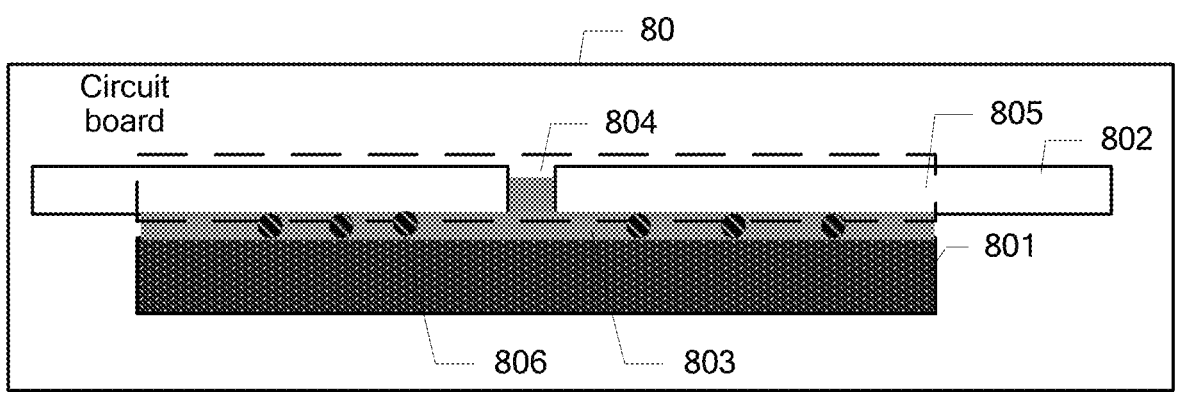

GLUE DISPENSING METHOD AND CIRCUIT BOARD

CROSS-REFERENCE TO RELATED APPLICATIONS

This application claims benefit of, and is a national stage of International Application No. PCT/CN2016/074537 filed on Feb. 25, 2016, which application is hereby incorporated herein by reference in its entirety.

TECHNICAL FIELD

The present invention relates to the field of electronic devices, and in particular, to a glue dispensing method and a circuit board.

BACKGROUND

Welding is a manufacturing process in which metals or other thermoplastic materials are joined by means of heating, a high temperature, or a high pressure, and is usually used to process a circuit board. A force borne by a welding joint is limited. When an excessively large external force is applied (for example, when an electronic device falls down), the welding joint easily breaks. Consequently, an electronic element on a circuit board falls off, and the electronic device becomes faulty. To improve reliability of the electronic device, when the circuit board is being processed, glue is usually used to bond the electronic element and a circuit board body, so as to achieve a reinforcement effect.

A glue dispensing process in the prior art is mainly as follows. After an electronic element is welded onto a circuit board, glue is dispensed on a bottom edge of the electronic element. The glue is filled in the bottom edge of the electronic element through a gap between the electronic element and the circuit board body. After the glue is cured, the glue dispensing process is completed.

When the electronic element is a surface mount component, the surface mount component is flatly mounted on the circuit board and occupies a particular region on the circuit board. Because the gap between the surface mount component and the circuit board body is very small, fluidity of the glue is poor. It is difficult for the glue to enter a central region of the bottom of the surface mount component, and can be cured only on a bottom edge of the surface mount component. Therefore, a fill void usually exists at the bottom of the surface mount component. Even though a glue dispensing amount is increased or a glue dispensing time is increased, it is difficult to fill up the entire bottom of the surface mount component. It can be learned that a bonding area between the surface mount component and the circuit board body is limited, and a bonding effect is poor.

SUMMARY

This application provides a glue dispensing method and a circuit board, to improve a bonding effect between a surface mount component and a circuit board body, and to improve reliability of a circuit board.

A first aspect of this application provides a glue dispensing method. The method may be applied to a circuit board having a circuit board body and a surface mount component. The method includes making a glue dispensing hole in a processing region. The processing region is a region that is in a surface mount region corresponding to the surface mount component and in which no electronic circuit and pad exist. The method also includes welding the surface mount component onto the circuit board. The method further includes injecting glue into the glue dispensing hole, to fill a gap between the surface mount component and the circuit board, and placing the circuit board still, to wait for curing of the glue. The glue diffuses at the bottom of the surface mount component through the glue dispensing hole, so that the gap between the surface mount component and the circuit board is filled well, and a poor bonding effect problem caused due to frequent occurrence of a fill void in the prior art is resolved.

With reference to the first aspect, in a first implementation of the first aspect of this application, after the welding the surface mount component onto the circuit board, and before the injecting glue into the glue dispensing hole, the method further includes: placing a side, on which the surface mount component is disposed, of the circuit board downward, and placing a side, on which the glue dispensing hole is disposed, of the circuit board upward. The glue can enter the glue dispensing hole from top to bottom, thereby helping implement a glue dispensing process.

With reference to the first aspect, in a second implementation of the first aspect of this application, the making a glue dispensing hole in a processing region includes: making the glue dispensing hole in the middle of the processing region. The glue diffuses from the middle of the processing region, thereby facilitating rapid filling of the glue.

With reference to the first aspect or any implementation of the first aspect, in a third implementation of the first aspect of this application, the surface mount component is a ball grid array package BGA element.

A second aspect provides a glue dispensing method. The method may be applied to a circuit board having a circuit board body and a connector socket. The method includes making a glue dispensing hole in a processing region. The processing region is a region that is in a mount region corresponding to the connector socket and in which no electronic circuit and pad exist. The method also includes welding the connector socket onto the circuit board; and injecting glue into the glue dispensing hole, to fill a gap between the connector socket and the circuit board, and placing the circuit board still, to wait for curing of the glue. The glue diffuses at the bottom of the connector socket through the glue dispensing hole, so that the gap between the connector socket and the circuit board is filled well, and a poor bonding effect problem caused due to frequent occurrence of a fill void in the prior art is resolved.

With reference to the second aspect, in a first implementation of the second aspect of this application, after the welding the connector socket onto the circuit board, and before the injecting glue into the glue dispensing hole, the method further includes: placing a side, on which the connector socket is disposed, of the circuit board downward, and placing a side, on which the glue dispensing hole is disposed, of the circuit board upward. The glue can enter the glue dispensing hole from top to bottom, thereby helping implement a glue dispensing process.

With reference to the second aspect or the first implementation of the second aspect, in a second implementation of the second aspect of this application, the making a glue dispensing hole in a processing region includes: making the glue dispensing hole in the middle of the processing region.

A third aspect provides a circuit board, including a circuit board body and a surface mount component. The surface mount component is flatly mounted on the circuit board body. A glue dispensing hole is disposed in a processing region on the circuit board body. The processing region is a region that is in a surface mount region corresponding to the surface mount component and in which no electronic circuit and pad exist. Glue is filled between the surface mount component and the circuit board body. The surface mount component can be firmly bonded with the circuit board body by using the glue, thereby improving reliability of the circuit board.

With reference to the third aspect, in a first implementation of the third aspect, the surface mount component is a ball grid array package BGA element, and a ball grid at the bottom of the BGA element is connected to a pad in the surface mount region.

With reference to the third aspect, in a second implementation of the third aspect, a diameter of the glue dispensing hole is 0.5 mm to 2 mm.

With reference to the third aspect or any implementation of the third aspect, in a third implementation of the second aspect, the glue dispensing hole is a non-metallic through-hole or a metallic through-hole, and a distance between the metallic through-hole and an electronic circuit or between the metallic through-hole and the pad is at least 0.2 mm.

A fourth aspect provides a circuit board, including a circuit board body and a connector socket. The connector socket is flatly mounted on the circuit board body. A glue dispensing hole is disposed in a processing region on the circuit board body, where the processing region is a region that is in a mount region corresponding to the connector socket and in which no electronic circuit and pad exist. Glue is filled between the connector socket and the circuit board body.

With reference to the fourth aspect, in a first implementation of the fourth aspect, a diameter of the glue dispensing hole is 0.5 mm to 2 mm.

With reference to the fourth aspect or the first implementation of the fourth aspect, in a second implementation of the fourth aspect, the glue dispensing hole is a non-metallic through-hole or a metallic through-hole, and a distance between the metallic through-hole and an electronic circuit or between the metallic through-hole and a pad is at least 0.2 mm.

According to the glue dispensing method provided in this application, the glue dispensing hole is made in the surface mount region corresponding to the surface mount component, then the glue is injected into the glue dispensing hole, and the glue diffuses at the bottom of the surface mount component through the glue dispensing hole. Therefore, the gap between the surface mount component and the circuit board can be filled well, and a poor bonding effect problem caused due to frequent occurrence of a fill void in the prior art is resolved.

BRIEF DESCRIPTION OF THE DRAWINGS

FIG. 6 is a schematic diagram of a circuit board having a USB connector socket in the prior art;

FIG. 7 is another schematic flowchart of a glue dispensing method according to an embodiment of the present invention;

FIG. 8 is a schematic diagram of a circuit board according to the present invention.

DETAILED DESCRIPTION OF ILLUSTRATIVE EMBODIMENTS

The following clearly and completely describes the technical solutions in the embodiments of the present invention with reference to the accompanying drawings in the embodiments of the present invention. Apparently, the described embodiments are merely some but not all of the embodiments of the present invention. All other embodiments obtained by persons skilled in the art based on the embodiments of the present invention without creative efforts shall fall within the protection scope of the present invention.

Figure 1:
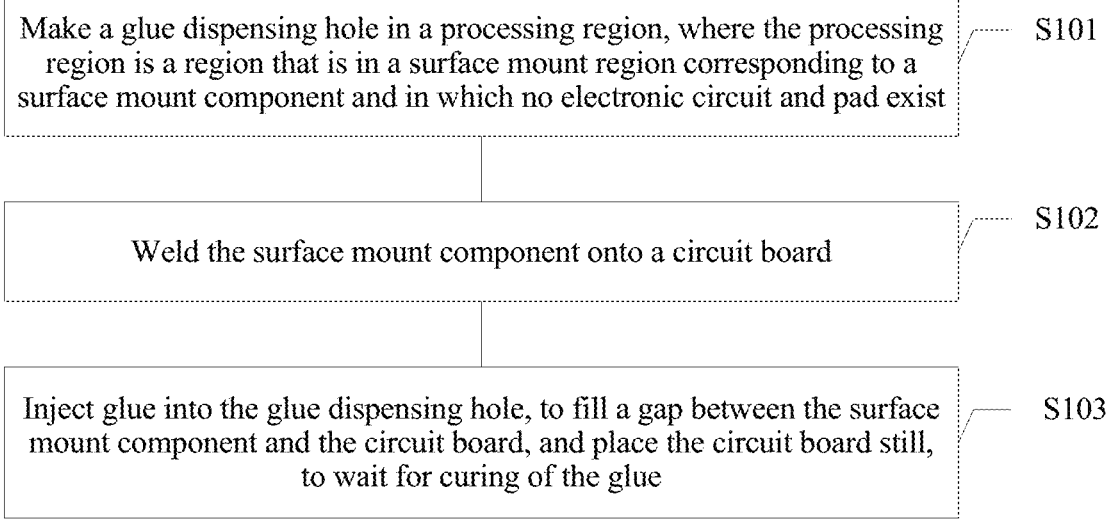
FIG. 1 is a schematic flowchart of a glue dispensing method according to an embodiment of the present invention.

This application is mainly applied to a process of processing a circuit board. A core of this application lies in processing a circuit board body, disposing an effective glue dispensing location, and dispensing glue at the effective glue dispensing location, so as to improve a bonding effect. The following describes a glue dispensing method provided in this application. Referring to FIG. 1, an embodiment of a glue dispensing method provided in this application includes the following steps.

Slot. Make a glue dispensing hole in a processing region, where the processing region is a region that is in a surface mount region corresponding to a surface mount component and in which no electronic circuit and pad exist.

In this embodiment, the surface mount region is a region that is occupied by the surface mount component on a circuit board in a flat-mounted manner, and includes a lead, a pad, and the like of the surface mount component. After a circuit diagram is printed on a circuit board body, the surface mount region corresponding to the surface mount component may be determined, and a puncturing location may be determined in a surface mount region (that is, the processing region) in which no circuit and pad exist. Then, a hole is punctured.

It may be understood that a circuit board processing device may puncture one or more holes. The one or more holes may be specifically disposed according to a size of the surface mount region and/or a gap between the surface mount component and the circuit board. Generally, the glue dispensing hole is round in shape. For ease of glue diffusion at the bottom of the component, it is better to set a diameter of the glue dispensing hole to at least 0.5 mm. The diameter may be 0.5 mm, 0.6 mm, 0.7 mm, 0.8 mm, 0.9 mm, 1.0 mm, 1.5 mm, 2.0 mm, or the like. Certainly, the diameter may also be less than 0.5 mm. Alternatively, a shape of the glue dispensing hole may be a regular shape such as an ellipse, a square, or a rectangle, or may be an irregular shape. This is not limited herein.

The glue dispensing hole may be a non-metallic through-hole or a metallic through-hole. When the through-hole is the metallic through-hole, a distance between a hole plate of the metallic through-hole and a pad or a circuit that is around the hole plate or between the hole plate and a circuit at the bottom of the surface mount component needs to be a secure distance and is usually set to at least 0.2 mm.

The circuit board body may be a printed circuit board (PCB), a flexible printed circuit board (FPC), or the like. The circuit board body may be a single board or certainly may be multiple boards. This is not limited herein.

S102. Weld the surface mount component onto the circuit board.

For a specific implementation process of welding the surface mount component onto the circuit board, refer to the prior art. Details are not described herein.

S103. Inject glue into the glue dispensing hole, to fill a gap between the surface mount component and the circuit board, and place the circuit board still, to wait for curing of the glue.

After the glue dispensing hole is made on the circuit board body, and the surface mount component is welded onto the circuit board, a glue dispensing device may inject glue into the glue dispensing hole. The glue diffuses at the bottom of the surface mount component, until the glue covers an entire or a large part of a region at the bottom of the surface mount component. The circuit board is placed still for a period of time. After the glue is cured, a glue dispensing process is completed. It may be understood that a glue amount may be set according to an actual application. Generally, a larger bonding area between the surface mount component and the circuit board body indicates higher reinforcement strength. A static placement time may be set according to an actual situation, and specific duration is not limited herein.

In another embodiment of this application, after step S102, and before step S103, the foregoing method may further include: placing a side, on which the surface mount component is disposed, of the circuit board downward, and placing a side, on which the glue dispensing hole is disposed, of the circuit board upward.

In this embodiment, after the surface mount component is fixed in the surface mount region on the circuit board body, the side, on which the through-hole is disposed, of the circuit board is placed upward. The glue is injected into the glue dispensing hole, and the glue may rapidly and effectively diffuse at the bottom of the surface mount component under the action of gravity.

In another embodiment of this application, step S101 may be specifically implemented in the following manner: making the glue dispensing hole in the middle of the processing region.

In this embodiment, the glue diffuses from the glue dispensing hole. Therefore, making the through-hole in the middle of the processing region helps fill the glue in the entire surface mount region rapidly.

In an actual application, the surface mount component may be a surface mount device (SMD) and/or a surface mount component (SMC).

Figure 2:
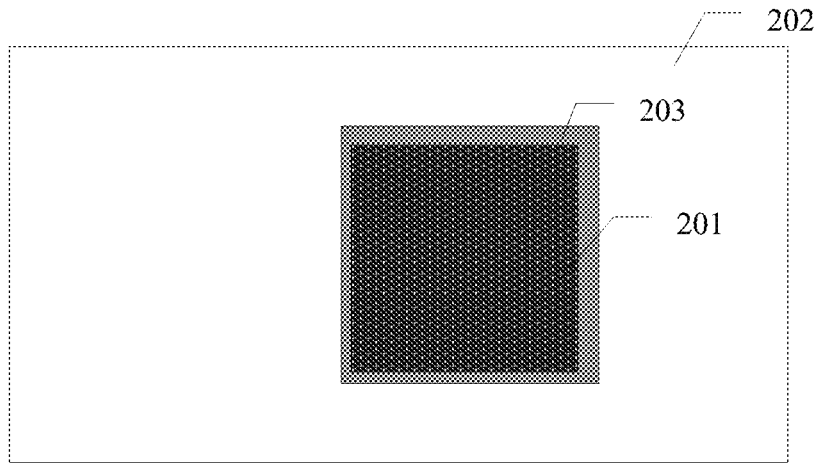
FIG. 2 is a schematic diagram of a circuit board in the prior art.
Figure 3:
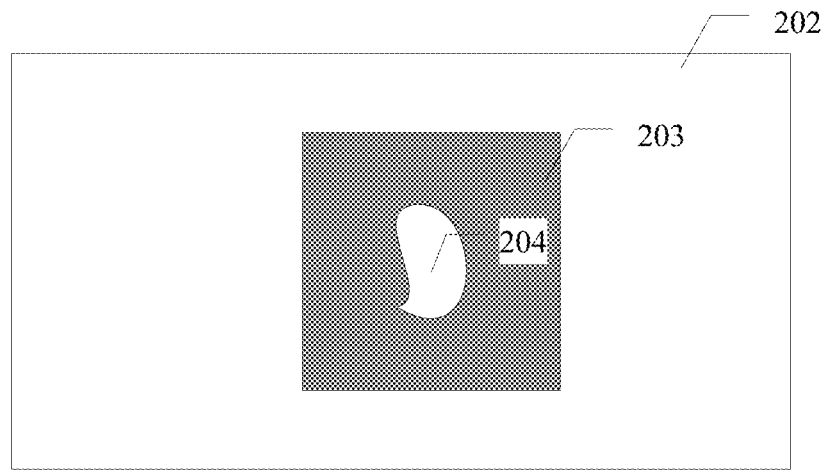
FIG. 3 is another schematic diagram of a circuit board in the prior art.

The surface mount component may be surface-mounted on the circuit board body by using a surface mount technology (SMT). A ball grid array package (BGA) is a packaging technology applied in the SMT. A ball grid array may be made as an input end or an output end of a circuit at the bottom of the circuit board on which the surface mount component is located, and be connected to the printed circuit board. An electronic element packaged in a BGA manner may be referred to as a BGA element 201, and a ball grid exists between the BGA element 201 and a circuit board body 202. Therefore, a height of a gap between the BGA element 201 and the circuit board body 202 is equal to a height of the ball grid. In the prior art, when glue is dispensed on a bottom edge of the BGA element, the glue 203 can only be filled on the bottom edge of the BGA element. As shown in FIG. 2, a ball grid array may lead the glue to the bottom of the BGA element by means of capillarity. However, when a non-ball grid region exists at the bottom of the BGA element, without capillarity of a ball grid array, it is difficult for the glue to fill in the entire non-ball grid region. Therefore, a fill void 204 occurs, as shown in FIG. 3. In this case, a bonding area between the BGA element and the circuit board body is limited, and a bonding effect is poor. In view of this, the following describes a glue dispensing method that is provided in this application and that is specifically applied to a BGA element.

Figure 4:
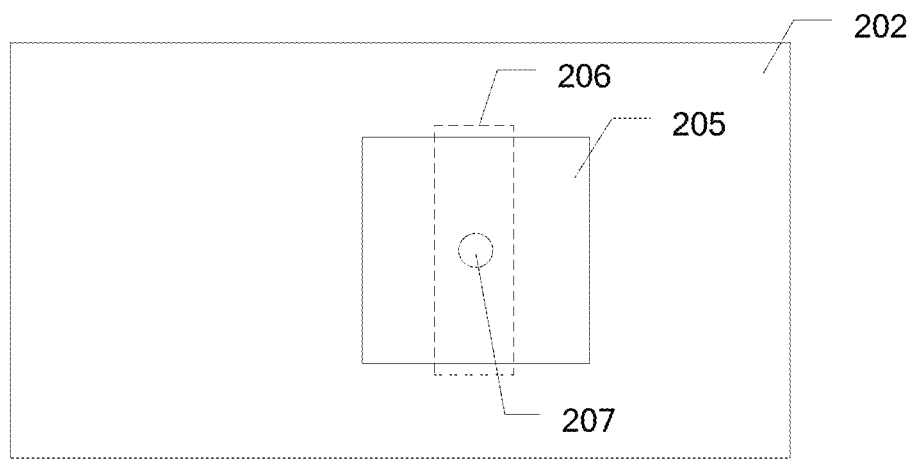
FIG. 4 is a schematic diagram of a circuit board body according to the present invention.
Figure 5:
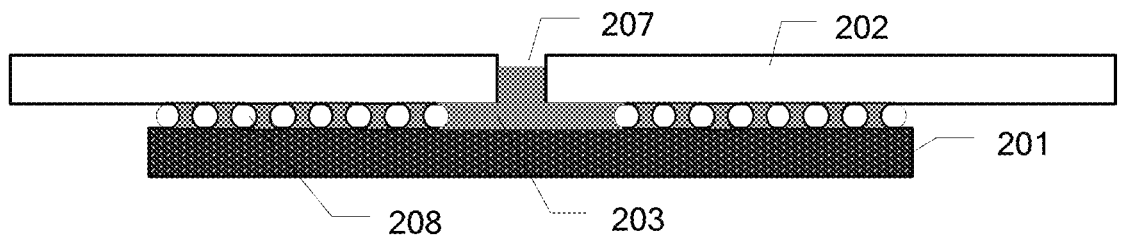
FIG. 5 is a schematic diagram of a circuit board having a BGA element according to the present invention.

A surface mount region 205 of the BGA element includes a ball grid array region and a non-ball grid region 206. A glue dispensing device may make a glue dispensing hole 207 in the non-ball grid region 206. As shown in FIG. 4, glue is injected into the non-ball grid region 206 from the glue dispensing hole 207, until the glue 203 covers the entire non-ball grid region 206. When the glue 203 diffuses to the ball grid array region 208, the glue may cover a ball grid array 208 by means of capillarity of the ball grid array, as shown in FIG. 5. It can be learned that according to the glue dispensing method in this application, a poor bonding effect problem caused due to occurrence of a fill void in the non-ball grid region is resolved, the bonding area between the BGA element and the circuit board body is increased, and the bonding effect is improved. Therefore, reliability of the circuit board is improved.

Some circuit boards include a connector. The connector includes a connector plug and a connector socket. In an actual application, when using a connector (for example, a USB connector), a user frequently inserts and removes the connector. A connector socket on a circuit board easily gets loose during repeated insertion and removal. Therefore, glue dispensing needs to be performed on the connector socket for reinforcement. In an existing glue dispensing method, glue is dispensed beside a contour of a connector socket 601. A gap between the connector socket 601 and a circuit board body 602 is quite small. It is difficult for the glue 603 to fill in the bottom of the connector socket 601, and can be filled only on a socket edge and around a welding joint 604. A bonding area is quite small, and reinforcement strength is quite low, as shown in FIG. 6. In view of this, the following describes a glue dispensing method that is provided in this application and that is specifically applied to a connector socket.

S701. Make a glue dispensing hole in a processing region, where the processing region is a region that is in a mount region corresponding to the connector socket and in which no electronic circuit and pad exist.

In this embodiment, the connector socket is flatly mounted on a circuit board. In the mount region corresponding to the connector socket, the region in which no electronic circuit and pad exist is the processing region of the connector socket. The glue dispensing hole in this embodiment is similar to the glue dispensing hole in the embodiment shown in FIG. 1. Details are not described herein again.

Step S701 may be specifically implemented in the following manner: making the glue dispensing hole in the middle of the processing region.

S702. Weld the connector socket onto a circuit board.

S703. Inject glue into the glue dispensing hole, to fill a gap between the connector socket and the circuit board, and place the circuit board still, to wait for curing of the glue.

In this embodiment, step S702 and step S703 are similar to step S102 and step S103 in the embodiment shown in FIG. 1. Details are not described herein again.

According to the glue dispensing method provided in this application, a problem that the glue cannot cover the entire bottom of the connector socket is resolved, a bonding area between the connector socket and a circuit board body is increased, and a bonding effect is improved. Therefore, reliability of the circuit board having the connector socket is improved.

In an embodiment of this application, after the connector socket is welded onto the circuit board, and before the glue is injected into the glue dispensing hole, the glue dispensing method provided in this application further includes: placing a side, on which the connector socket is disposed, of the circuit board downward, and placing a side, on which the glue dispensing hole is disposed, of the circuit board upward. This embodiment is similar to an optional embodiment of the embodiment shown in FIG. 1. Details are not described herein again.

For ease of understanding, the following describes, by using a specific application scenario, in detail a glue dispensing method provided in this application.

A PCB is used as an example of a circuit board, and a central processing unit (CPU) CPU is used as an example of a surface mount component. A ball grid array is disposed at the bottom of the CPU.

In a surface mount region of the CPU on the PCB, a location in which no circuit and pad exist is selected to puncture a round hole with a diameter of 0.5 mm, and the CPU is welded onto the PCB.

Glue is injected into the round hole. The glue diffuses in a non-ball grid region at the bottom of the CPU. After a gap between the CPU and the PCB is filled with the glue, glue dispensing is stopped, and the PCB is placed still for a period of time. After the glue is cured, a glue dispensing process is completed. Compared with the prior art, according to the glue dispensing method in this application, the entire gap between the CPU and the PCB can be filled up. Therefore, a stronger bonding force is provided, and a bonding effect is improved.

A USB connector socket is used as an example of the connector socket. A hole is punctured in the middle of a mount region of the USB connector socket. Glue is dispensed into the hole. The glue diffuses in a gap between the USB connector socket and the PCB, until the glue covers the entire gap. The PCB is placed still for a period of time. After the glue is cured, a glue dispensing process is completed. Compared with the prior art, according to the glue dispensing method in this application, the entire gap between the USB connector socket and the PCB can be filled up. Therefore, a stronger bonding force is provided, and a bonding effect is improved.

The foregoing describes the glue dispensing method in this application from a method perspective. The following describes a circuit board in this application from a product perspective.

Referring to FIG. 8, this application provides a circuit board 800, including a circuit board body 802 and a surface mount component 801. The surface mount component 8001 is flatly mounted on the circuit board body 802. A glue dispensing hole 804 is disposed in a processing region on the circuit board body. The processing region is a region that is in a surface mount region 805 corresponding to the surface mount component 801 and in which no electronic circuit and pad exist. Glue 803 is filled between the surface mount component 801 and the circuit board body 802. It may be understood that the surface mount component 8001 is fixed on the circuit board body 802 by using a welding joint 806.

The following further describes the surface mount component 8001 in this embodiment.

In another embodiment of this application, the surface mount component 8001 is a BGA element. A ball grid at the bottom of the BGA element is connected to a pad in the surface mount region.

The following further describes the glue dispensing hole 804 on the circuit board provided in this application.

A diameter of the glue dispensing hole 904 is 0.5 mm to 2 mm.

In an embodiment of this application, the glue dispensing hole 804 is a non-metallic through-hole.

In another embodiment of this application, the glue dispensing hole 804 is a metallic through-hole, and a distance between the metallic through-hole and an electronic circuit or between the metallic through-hole and the pad is at least 0.2 mm.

Figure 9:
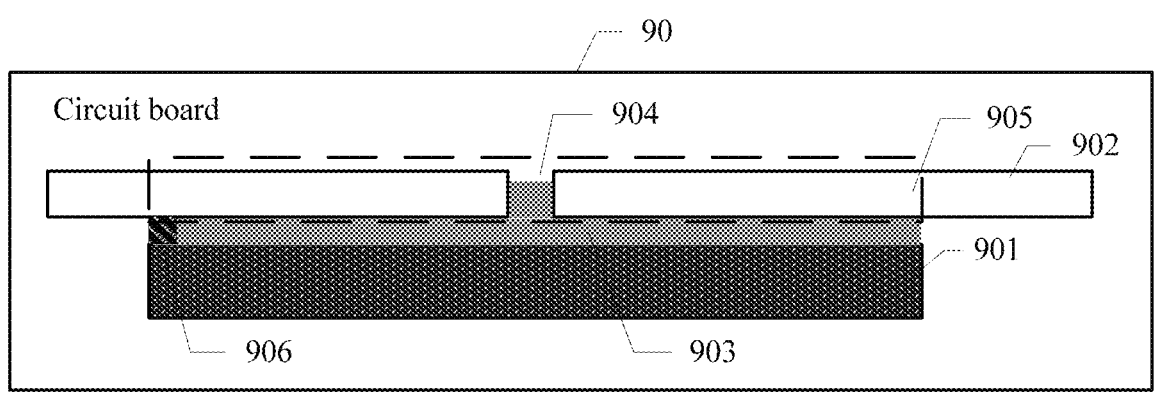
FIG. 9 is another schematic diagram of a circuit board according to the present invention.

Referring to FIG. 9, this application further provides a circuit board 90, including a circuit board body 902 and a connector socket 901.

The connector socket 901 is flatly mounted on the circuit board body 902. A glue dispensing hole is disposed in a processing region on the circuit board body 902. The processing region is a region that is in a mount region 905 corresponding to the connector socket and in which no electronic circuit and pad exist. Glue 903 is filled between the connector socket 901 and the circuit board body 902. It may be understood that the connector socket 900 is fixed on the circuit board body 902 by using a welding joint 906. The glue dispensing hole 904 in this embodiment is similar to the glue dispensing hole 804 in the embodiment shown in FIG. 8. Details are not described herein again.

The foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A circuit board assembly, comprising:
   a circuit board body;
   a surface mount component that is mounted on the circuit board body, wherein the surface mount component comprises a ball grid array (BGA) package, and the BGA package comprises a BGA package body, a first BGA connected to the BGA package body, and a second BGA connected to the BGA package body, the first BGA being separated from the second BGA by a non-BGA region;
   a glue dispensing hole disposed in a processing region of the circuit board body, wherein the processing region of the circuit board body comprises a part of a surface mount region of the surface mount component, wherein the part of the surface mount region is without electronic circuit or pad; and
   glue extending in the glue dispensing hole and extending between the surface mount component and the circuit board body, wherein the glue fills only a portion of the glue dispensing hole, and wherein the glue completely encapsulates sidewalls of a first plurality of balls of the first BGA and sidewalls of a second plurality of balls of the second BGA, the first plurality of balls are in-line between the glue dispensing hole and a first edge of the surface mount component, the second plurality of balls are in-line between the glue dispensing hole and a second edge of the surface mount component, the first edge is opposite to the second edge, the sidewalls of the first plurality of balls extend between the circuit board body and the BGA package body, and the sidewalls of the second plurality of balls extend between the circuit board body and the BGA package body, and wherein the glue in a region between a surface of the surface mount component and an opposing surface of the circuit board body does not extend beyond the first and second edges of the surface mount component;

wherein the circuit board assembly comprises a plurality of glue dispensing holes in the processing region of the circuit board body, wherein each glue dispensing hole of the plurality of glue dispensing holes is a metallic through-hole, and wherein a distance between each metallic through-hole and an electronic circuit, or between each metallic through-hole and a pad, is at least 0.2 mm.

2. The circuit board assembly according to claim 1,
wherein the surface mount region comprises a ball grid region and a non-ball grid region;
wherein the ball grid region comprises a pad, and the pad is connected to a ball of the first plurality of balls of the BGA package; and
wherein the processing region opposite to the non-BGA region of the BGA package.

3. The circuit board assembly according to claim 1, wherein a diameter of the glue dispensing hole is 0.5 mm to 2 mm.

4. The circuit board assembly according to claim 1, wherein the circuit board body comprises a printed circuit board (PCB) or a flexible printed circuit board (FPC).

5. The circuit board assembly according to claim 1, wherein the surface mount component comprises a central processing unit (CPU).

6. A circuit board, comprising:
a circuit board body;
a connector socket that is flatly mounted on the circuit board body, wherein the connector socket overlies an edge of the circuit board body, the connector socket is flatly mounted on the circuit board body by a plurality of weld joints, and the plurality of weld joints extends along an edge of the connector socket that is farthest from the edge of the circuit board body;
a glue dispensing hole disposed in a processing region of the circuit board body, wherein the processing region comprises a part of a region of the circuit board body on which the connector socket is mounted, wherein the part of the region on which the connector socket is mounted is without electronic circuit or pad, and wherein the glue dispensing hole is disposed between the plurality of weld joints and the edge of the circuit board body; and
glue disposed between the connector socket and the circuit board body, wherein the glue underlies the glue dispensing hole, the glue fills a space between the connector socket and the circuit board, and the glue fills only a portion of the glue dispensing hole, and wherein the glue in a region between a surface of the connector socket and an opposing surface of the circuit board body does not extend beyond a first edge and a second edge of the connector socket, wherein the first edge is opposite to the second edge of the connector socket, and the first edge and second edge each at least partially overlap the circuit board body;

wherein the circuit board comprises a plurality of glue dispensing holes in the processing region of the circuit board body, wherein each glue dispensing hole of the plurality of glue dispensing holes is a metallic through-hole, and wherein a distance between each metallic through-hole and an electronic circuit, or between each metallic through-hole and a pad, is at least 0.2 mm.

7. The circuit board according to claim 6, wherein a diameter of the glue dispensing hole is 0.5 mm to 2 mm.

8. The circuit board according to claim 6, wherein the glue dispensing hole is a non-metallic through-hole or a metallic through-hole, and a distance between the metallic through-hole and an electronic circuit or between the metallic through-hole and a pad is at least 0.2 mm.

9. The circuit board according to claim 6, wherein the circuit board body comprises a printed circuit board (PCB) or a flexible printed circuit board (FPC).

10. A device, comprising:
a circuit board comprising a glue dispensing hole in a processing region of the circuit board, wherein the processing region of the circuit board is free of any pads or circuits;
a surface mount component mounted on the circuit board, wherein a surface mount region of the circuit board is opposite to the surface mount component, wherein the processing region of the circuit board comprises a part of the surface mount region of the surface mount component; and
glue extending between the surface mount component and the circuit board, wherein the glue fills a gap between the surface mount component and the circuit board, the glue contacts the surface mount component and the circuit board, and the glue fills only a portion of the glue dispensing hole, and wherein the glue in a region between a surface of the surface mount component and an opposing surface of the circuit board does not extend beyond a first edge and a second edge of the surface mount component, wherein the first edge is opposite to the second edge of the surface mount component;
wherein the device comprises a plurality of glue dispensing holes in the surface mount region of the circuit board, wherein each glue dispensing hole of the plurality of glue dispensing holes is a metallic through-hole, and wherein a distance between each metallic through-hole and an electronic circuit, or between each metallic through-hole and a pad, is at least 0.2 mm.

11. The device according to claim 10, wherein the glue dispensing hole is positioned in a middle of the processing region.

12. The device according to claim 10, wherein the surface mount component is welded to the circuit board.

13. The device according to claim 10, wherein the surface mount component is a ball grid array package (BGA) element.

14. The device according to claim 13, wherein the part of the surface mount region is opposite to a non-ball grid region in the BGA element when the BGA element is mounted onto the circuit board; and
wherein the gap comprises a space between the non-ball grid region and the processing region.

15. The device according to claim 14, wherein the glue extends in a ball-grid region in the BGA element.

* * * * *